(12) United States Patent
Hwang

(10) Patent No.: US 6,731,519 B1
(45) Date of Patent: May 4, 2004

(54) 2×4 SHIELDING CAGE ASSEMBLY ADAPTED FOR MULTIPLE TRANSCEIVER MODULES

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/455,926

(22) Filed: Jun. 6, 2003

(51) Int. Cl.⁷ .................................................. H05K 9/00
(52) U.S. Cl. ........................ 361/818; 361/816; 361/732; 361/741; 361/740; 174/35 R
(58) Field of Search ................................. 361/683–686, 361/724–732, 740–742, 747, 752, 753, 756, 758, 759, 799–802, 804, 807, 814, 816, 818; 174/35 R, 35 MS, 50, 52; 439/607, 608, 939; 312/223.1, 223.2; 211/41.17

(56) References Cited

U.S. PATENT DOCUMENTS 5,394,305 A * 2/1995 Moral et al. ................. 361/796
6,558,191 B2 * 5/2003 Bright et al. ............ 439/541.5

* cited by examiner

Primary Examiner—Phuong T. Vu
(74) Attorney, Agent, or Firm—Wei Te Chung

(57) ABSTRACT

A shielding cage assembly (10) for shielding a plurality of transceiver modules therein includes a conductive hanger (1), a conductive upper and lower shielding cages (21, 22) and a spacer (3). A plurality of dividing walls (23, 25), inside the upper and lower shielding cages cooperatively define a plurality of channels for receiving the transceiver modules therein. The spacer is sandwiched between the stacked upper and lower shielding cages.

13 Claims, 6 Drawing Sheets

2×4 SHIELDING CAGE ASSEMBLY ADAPTED FOR MULTIPLE TRANSCEIVER MODULES

BACKGROUND OF THE INVENTION

1. Field of the Invention

This invention relates generally to a cage for shielding components from electromagnetic interference, and more particularly to a shielding cage assembly for arranging a plurality of transceiver modules therein.

2. Description of the Related Art

A transceiver module is a discrete unit used in interface communications equipment, and is normally singly received in a cage that provides shielding against electromagnetic interference (EMI). Prior art shielded transceiver modules are too difficult to assemble densely to a circuit board. Therefore, an inexpensive shielding cage assembly that will allow transceiver modules to be easily and densely mounted on a circuit board is required.

Referring to FIGS. 6, a prior art shielding cage assembly 100 for shielding a plurality of transceiver modules (not shown) therein includes a conductive body cage 1, a conductive cover cage 2 and a plurality of dividing walls 3, which cooperatively define a plurality of hollow spaces for receiving the transceiver modules therein. Retaining tabs 121, 311 are respectively formed on the body cage 1 and the dividing walls 3, and engage in a corresponding plurality of slots 24a, 24 defined in the cover cage 2 to hold the cover cage 2 to the body cage 1 and to fix the dividing walls 3 between the cover cage 2 and body cage 1.

However, this kind of structure cannot satisfy the requirement to stackably mount transceiver modules in interface communications equipment. Therefore, an improved shielding cage assembly that is adapted for receiving a plurality of transceiver modules therein is desired.

SUMMARY OF THE INVENTION

A main object of the present invention is to provide a shielding cage assembly for receiving a plurality of transceiver modules therein while allowing good air ventilation to the transceiver modules.

A shielding cage assembly according to the present invention for shielding a plurality of transceiver modules therein includes a conductive hanger, a conductive upper and lower shielding cages and a spacer. A plurality of dividing walls cooperatively defines a plurality of hollow spaces inside each of the upper and lower shielding cages for receiving the transceiver modules therein. The spacer is sandwiched between the stacked upper and lower shielding cages. The upper and lower shielding cages are electrically connected through the spacer.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
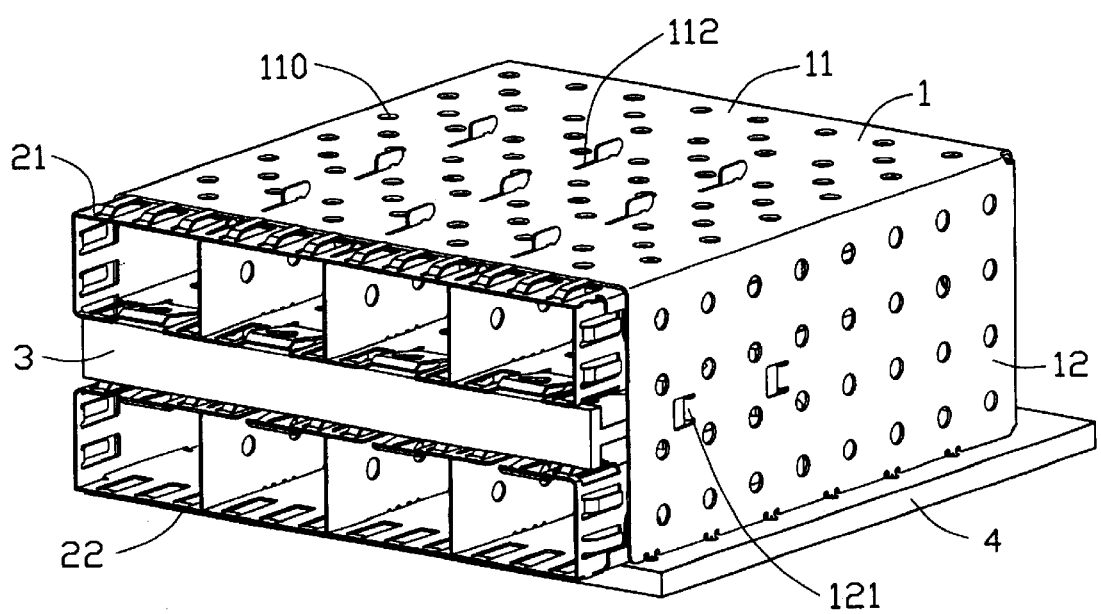
FIG. 1 is an assembled view of the shielding cage assembly in accordance with the present invention, mounted to a printed circuit board.

Referring to FIG. 1, a shielding cage assembly 10 in accordance with the present invention includes a metal hanger 1, an upper shielding cage 21, a lower shielding cage 22 and a spacer 3. The hanger 1 covers the upper and lower shielding cages 21, 22 and the spacer 3.

Figure 2:
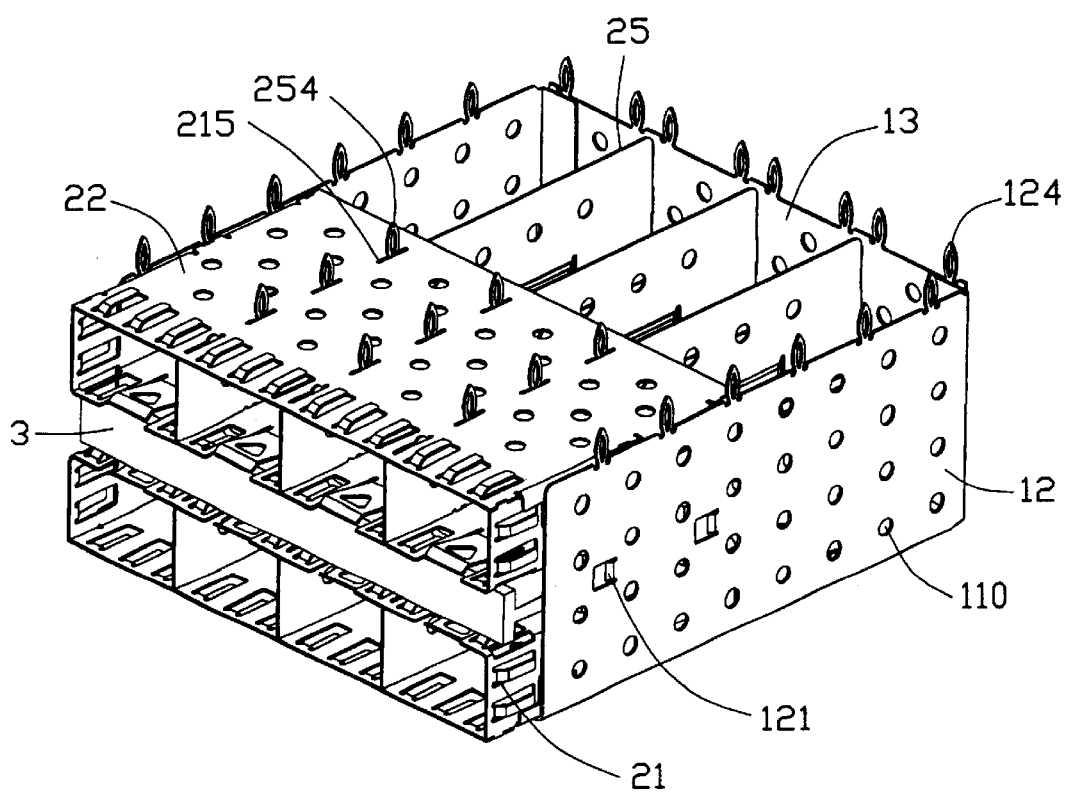
FIG. 2 is a reverse view of the shielding cage assembly of FIG. 1.

Referring also to FIG. 2, the hanger 1 is formed from a single sheet of metal and is pressed into a rectangular receptacle box, which includes a top wall 11, two side walls 12 extending downwardly therefrom and a rear wall 13 extending between the two side walls. An opening (not labeled) is formed by the top and side walls and having a rearwardly bounding at the rear wall 13. A plurality of mounting pins 124 with needle-eyes respectively extends downwardly from the side and rear walls 12, 13. A plurality of slits 112 is defined through the top wall 11, arranged in parallel lines in a frontward to rearward direction. A pair of stoppers 121 extends inwardly from each side wall 12 to engage with the spacer 3, which is received in the hanger 1, to prevent the spacer 3 from moving backwardly and frontwardly relative to the hanger 1. A plurality of through holes 110 is defined through all walls of the hanger 1 for dissipation of heat generated in the transceiver modules received in the SFP cage assembly 10.

Figure 3:
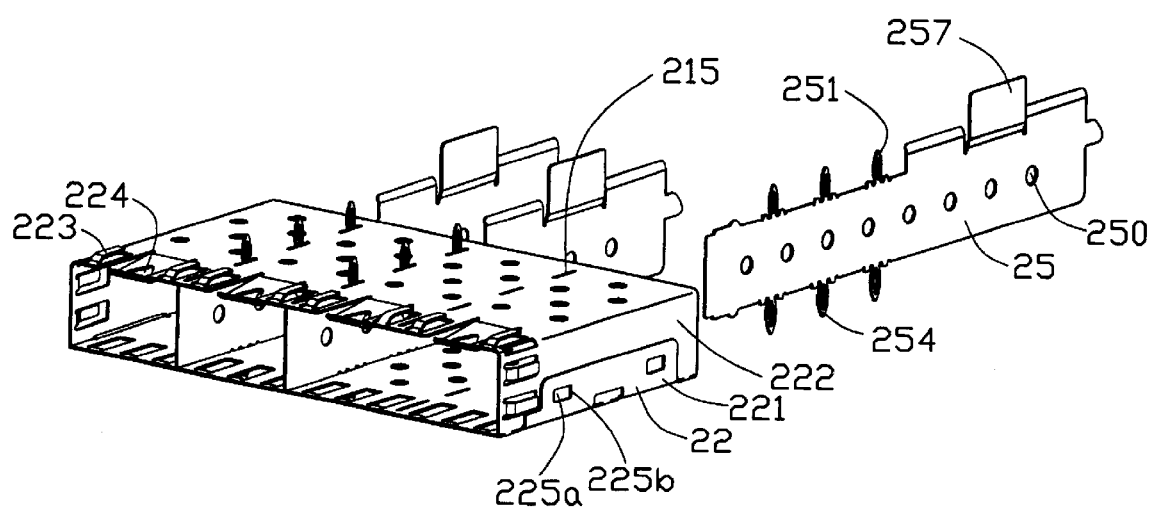
FIG. 3 is a perspective view of a lower shielding cage of the shielding cage assembly of FIG. 1, wherein a lower dividing wall is removed.

Referring to FIGS. 2 and 3, the lower shielding cage 22 includes conductive first and second portions 221, 222. The second portion 222 overlies the first portion 221. A pair of retaining tabs 225a formed in each side of the second portion 222 is received in a pair of receiving slots 225b defined in each side of the first portion 221. A plurality of notches 215 is defined through the second portion 222 and the first portion 221 arranged in parallel lines in a frontward to rearward direction. A plurality of ground tabs 223 is formed near an opening 220 of the lower shielding cage 22 for making grounding contact with an outer wall of a communications interface (not shown). A plurality of releasing tabs 224 extends inwardly at an angle from the second portion 222 into the opening 220. Each releasing tab 224 defines a triangular shaped opening (not labeled) therethrough for securing a transceiver module therein. The releasing tab 224 can be depressed to remove the transceiver module from the SFP cage assembly 10.

A plurality of conductive lower dividing walls 25 is inserted in the lower shielding cage 22 and divides an inner space of the lower shielding cage 22 into a plurality of channels (for example, FIG. 1 shows a 2×4 format shielding cage assembly having four channels per shielding cage 21, 22). Each channel receives a transceiver module therein. Each lower dividing wall 25 is elongated, and includes a plurality of mounting pins 251 extending upwardly from an upper, forward edge thereof and a plurality of mounting pins 254 extending downwardly from a lower, forward edge thereof. Each mounting pin 251, 254 defines a needle eye therethrough. A protrusion 257 extends from an upper, rearward edge of the dividing wall 25. A plurality of through holes 250 is defined through the dividing wall 25 for good air ventilation. The mounting pins 251 pass through the corresponding notches 215 of the second portion 222, and the mounting pins 254 pass through the corresponding notches 215 of the first portion 221.

Figure 5:
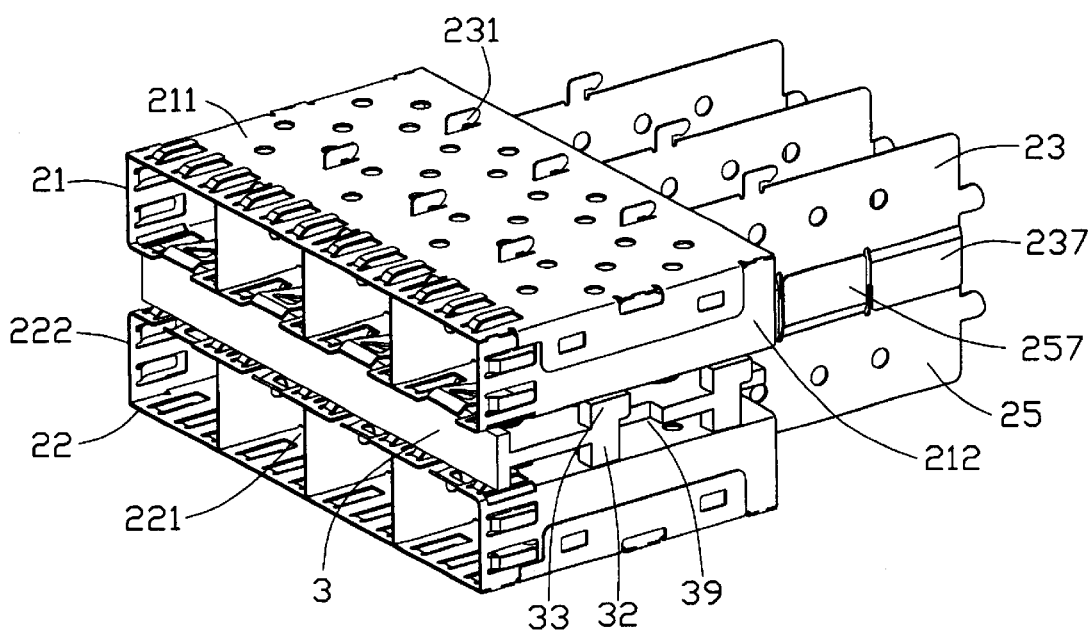
FIG. 5 is a perspective view of a spacer of the shielding cage assembly of FIG. 1.
Figure 6:
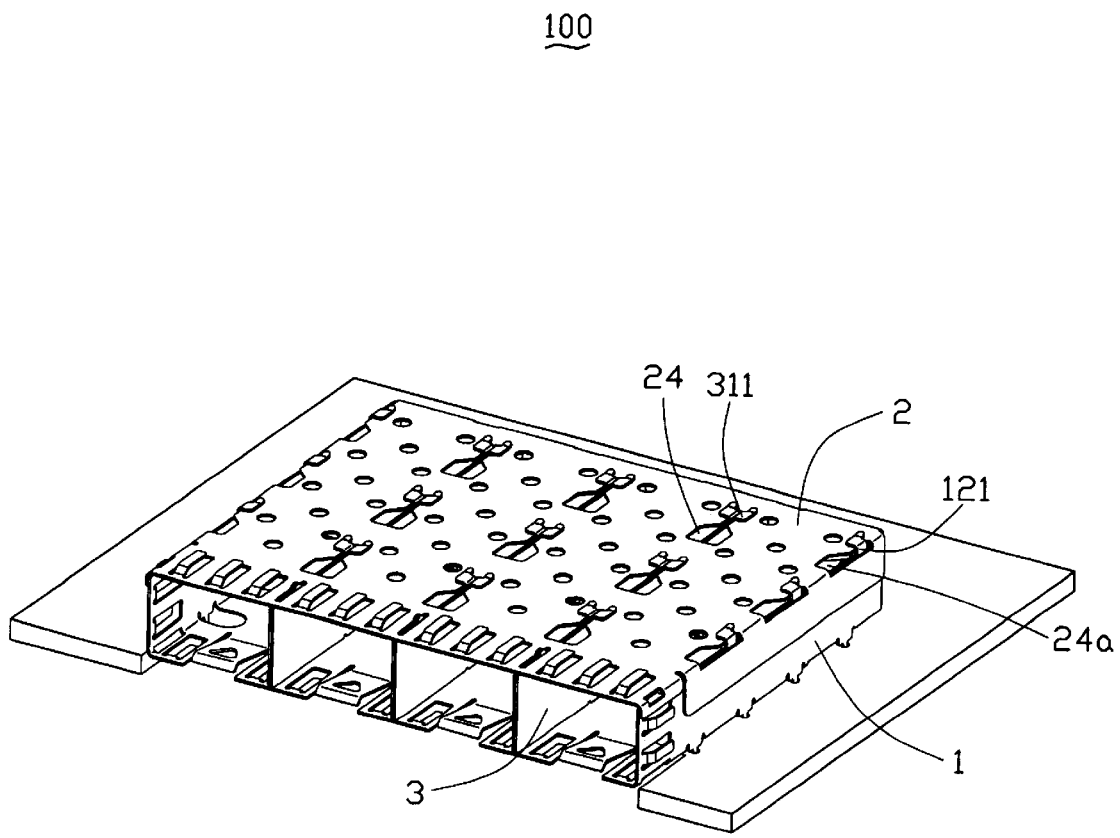
FIG. 6 is a perspective view of a shielding cage assembly according to prior art.

Referring to FIG. 5, the conductive upper shielding cage 21 is substantially similar to the lower shielding cage 22 in structure. A plurality of conductive upper dividing walls 23 is received in the upper shielding cage 21. The upper dividing walls 23 are lower dividing walls 25 received in the lower shielding cage 22, one difference being a plurality of retaining tabs 231 being formed on an upper edge of the dividing wall 23 in place of the mounting pins 251 of the lower dividing wall 25. The retaining tabs 231 pass through notches (not labeled) of the first portion 211. Similarly a plurality of mounting pins 234 (not shown) formed on a lower edge of the dividing wall 23 and similar to the mounting pins 254 of the lowers diving wall 25 defined in the bottom portion 212, said notches being similar to the notches 215 in the lower shielding cage 22.

Figure 4:
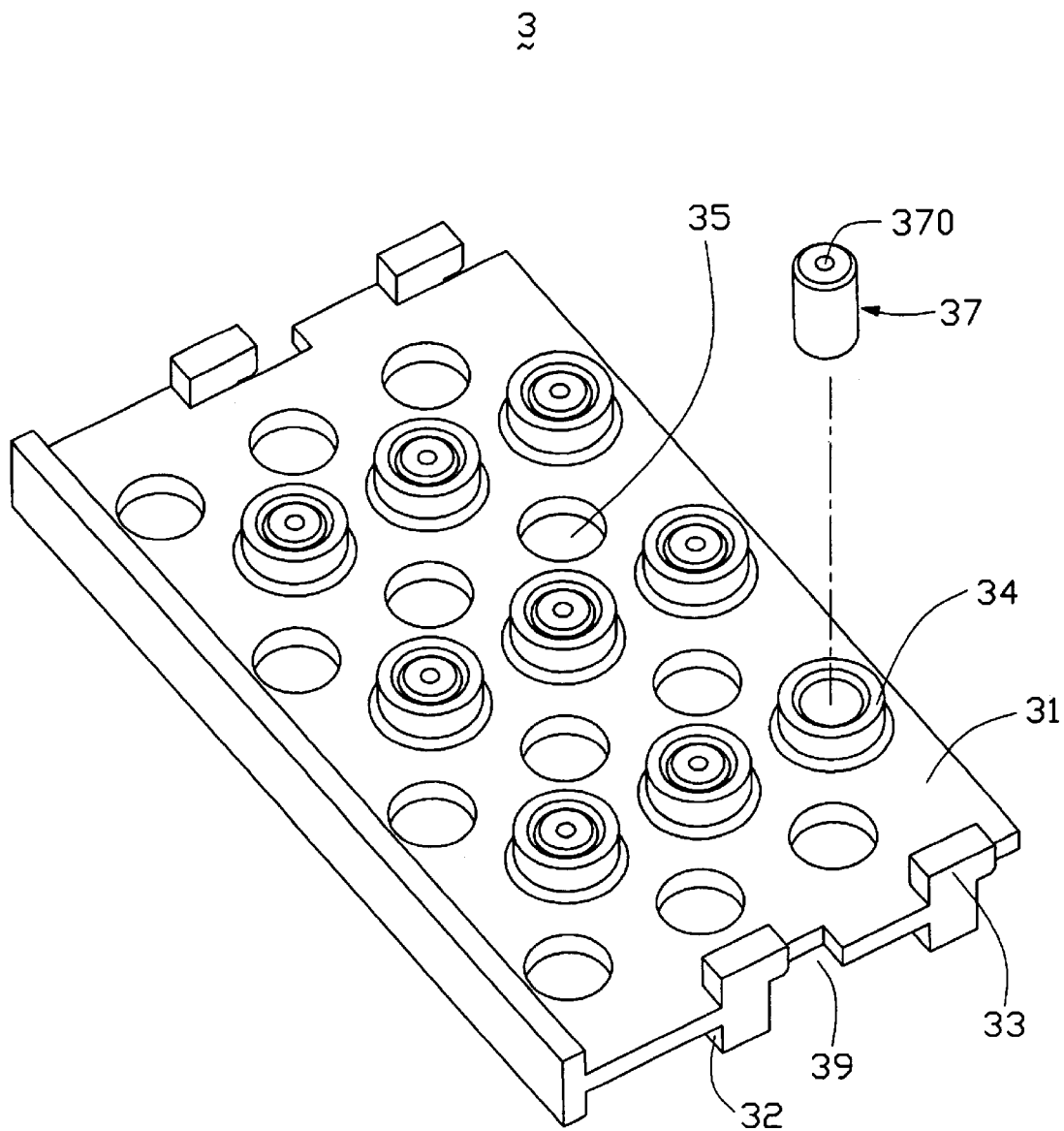
FIG. 4 a perspective view of the shielding cage assembly of FIG. 1, a hanger is removed.

Referring to FIG. 4, the spacer 3 is die-cast and is made of conductive material. The spacer 3 includes a rectangular base 31, a pair of bulges 32 extending downwardly from a bottom surface of the base 31 at each side of the base 31 and a pair of blocks 33 extending upwardly from a top surface of the base 31 of each side of the base 31. A recess 39 is defined in side edge of the base 31. A plurality of hollow poles 34 is formed in the base 31 arranged in lines. A copper ring 37 with a mounting hole 370 is inserted in each hollow pole 34 for receiving the mounting pins 234, 251 of the upper and lower dividing walls 23, 25 therein. A plurality of holes 35 is defined through the base 31 for good air ventilation.

In assembly, the dividing walls 23, 25 are respectively inserted into the first or second portions of the upper and lower shielding cages 21, 22, and the corresponding second or first portions of the shielding cages 21, 22 are assembled thereto to create completely assembled upper and lower shielding cages 21, 22. The second portion 222 of the shielding cage 22 is upward, the spacer 3 is mounted thereonto, the bulges 32 of the spacer 3 being positioned on the second portion 222, and the mounting pins 251 of the dividing walls 25 being inserted into the mounting holes 370 of the copper rings 37. The mounting holes 370 of the copper rings 37 are filled with electrically conductive epoxy and fix the upper shielding cage 21 to the spacer 3, the mounting pins 234 being inserted into the holes 370 of the copper rings 37. The epoxy is curved in an oven so that the upper shielding cage 21 is well ground with the lower shielding cage 22 through the copper rings 37. Conductive epoxy herein offers both electrical and mechanical functions after curing. The protrusions 237, 257 of the dividing walls 23, 25 come in complementary pairs. Thus, the upper cage 21 and lower cage 22 are stacked and are placed belly-to-belly, and the spacer 3 is sandwiched therebetween for providing good air ventilation. The channels formed inside the upper and lower shielding cages 21, 22 are used to receive a plurality of transceiver modules therein. The hanger 1 encloses the upper and lower shielding cages 21, 22, and the retaining tabs 231 pass through corresponding slits 112 and are soldered to the hanger 1. The mounting pins 124 of the hanger 1 are received within mounting holes (not shown) of the PCB 4, where they can be soldered or otherwise fixed therein. Assembly of the shielding cage assembly 10 is completed.

Although the present invention has been described with specific terms, it should be noted that the described embodiments are not necessarily exclusive, and that various changes and modifications may be made thereto without departing from the scope of the present invention as defined in the appended claims.

What is claimed is:

1. A shielding cage assembly for accommodating a plurality of transceiver modules therein, comprising:

an upper shielding cage made of electrically conductive material and having a plurality of channels therein for respectively receiving a plurality of transceiver modules therein;

a lower shielding cage made of electrically conductive material and having a plurality of channels for respectively receiving a plurality of transceiver modules therein;

a spacer being sandwiched between the upper and lower shielding cages; and a hanger made of electrically conductive material and enclosing the upper and lower shielding cages for providing EMI suppression;

wherein the upper and lower shielding cages are electrically connected together.

2. The shielding cage assembly as claimed in claim 1, wherein the upper and lower shielding cages each respectively include a first portion and a bottom portion.

3. The shielding cage assembly as claimed in claim 2, wherein a plurality of upper and lower dividing walls is respectively inserted into the upper and lower shielding cages to form the plurality of channels therein.

4. The shielding cage assembly as claimed in claim 3, wherein the upper and lower dividing walls are complementary with each other and connect together in pairs.

5. The shielding cage assembly as claimed in claim 4, wherein the upper dividing wall includes a plurality of retaining tabs and a plurality of mounting pins extending respectively from upper and lower edges thereof.

6. The shielding cage assembly as claimed in claim 4, wherein the lower dividing wall includes a plurality of mounting pins that are respectively formed on opposite upper and lower edges of the lower dividing wall.

7. The shielding cage assembly as claimed in claim 1, wherein the spacer includes a plurality of conductive rings therein.

8. The shielding cage assembly as claimed in claim 7, wherein the upper shielding cage grounds with the lower shielding cage through the conductive rings.

9. The shielding cage assembly as claimed in claim 7, wherein the conductive rings are made of copper.

10. The shielding cage assembly as claimed in claim 7, wherein a through hole is defined through each conductive ring and is filled with an electrically conductive epoxy.

11. The shielding cage assembly as claimed in claim 5, wherein a plurality of slits is defined through the hanger for receiving the retaining tabs of the upper dividing walls therein.

12. A shielding cage assembly for accommodating a plurality of electronic or optoelectronic devices therein, comprising:

a first shielding cage made of electrically conductive material and receiving a plurality of electronic or optoelectronic devices therein; and a second shielding cage made of electrically conductive material and for receiving electronic or optoelectronic devices therein;

wherein the first shielding cage and the second shielding cage are stacked, and a space exists therebetween for providing good air ventilation wherein a plurality of electrically conductive vertical inner partitions are arranged in said first and second shielding cages to form a plurality of channels therebetween for receiving the electronic or optoelectronic devices therein, wherein a spacer is sandwiched between the first and second shielding cages and the first and second shielding cages are electrically connected through the spacer and the shielding cage assembly further including an electrically conductive hanger covering the first and second shielding cages for EMI suppression.

13. The shielding cage assembly as claimed in claim 12, wherein the first and second shielding cages are placed belly-to-belly.

* * * * *